United States Patent [19]
Forbes et al.

[11] Patent Number: 6,075,272
[45] Date of Patent: *Jun. 13, 2000

[54] STRUCTURE FOR GATED LATERAL BIPOLAR TRANSISTORS

[75] Inventors: Leonard Forbes, Corvallis, Oreg.; Wendell P. Noble, Milton, Vt.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/050,266

[22] Filed: Mar. 30, 1998

[51] Int. Cl.[7] .......................... H01L 29/76; H01L 27/082
[52] U.S. Cl. .......................... 257/378; 257/162; 257/273; 257/557; 257/575
[58] Field of Search .................. 257/134, 141, 257/153, 162, 256, 262, 273, 343, 370, 378, 557, 575

[56] References Cited

U.S. PATENT DOCUMENTS

| | | | |
|---|---|---|---|
| 4,450,048 | 5/1984 | Gaulier | 204/15 |
| 4,673,962 | 6/1987 | Chatterjee et al. | 357/23.6 |
| 4,922,315 | 5/1990 | Vu | 357/35 |
| 4,987,089 | 1/1991 | Roberts | 437/34 |
| 4,996,574 | 2/1991 | Shirasaki | 357/23.7 |
| 5,006,909 | 4/1991 | Kosa | 357/23.6 |
| 5,023,688 | 6/1991 | Ando et al. | 357/42 |
| 5,097,381 | 3/1992 | Vo et al. | 361/313 |
| 5,122,848 | 6/1992 | Lee et al. | 357/23.6 |
| 5,250,450 | 10/1993 | Lee et al. | 437/40 |
| 5,315,143 | 5/1994 | Tsuji | 257/351 |
| 5,350,934 | 9/1994 | Matsuda | 257/139 |
| 5,491,356 | 2/1996 | Dennison et al. | 257/306 |
| 5,508,544 | 4/1996 | Shah | 257/316 |
| 5,528,062 | 6/1996 | Hsieh et al. | 257/298 |
| 5,541,432 | 7/1996 | Tsuji | 257/350 |
| 5,554,870 | 9/1996 | Fitch et al. | 257/334 |
| 5,581,104 | 12/1996 | Lowrey et al. | |

(List continued on next page.)

FOREIGN PATENT DOCUMENTS

431855 B1  11/1990  European Pat. Off. ...... H01L 29/772

OTHER PUBLICATIONS

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17, 509–511, (Nov. 1996).

Fuse, T., et al., "A 0.5V 200MHz 1–Stage 32b ALU Using a Body Bias Controlled SOI Pass–Gate Logic", *1997 IEEE International Solid–State Circuits Conferece, Digest of Technical Papers*, 286–287, (1997).

Horiguchi, et al., "Switched–Source–Impedance CMOS Circuit for Low Standby Subthreshold Current Giga–Scale LSIs", *IEEE Journal of Solid State Circuits*, vol. 28, 1131–1135, (1993).

Jaeger, et al., "A High–speed Sensing Scheme for 1T Dynamic RAMs Utilizing the Clamped Bit–line Sense Amplifier", *IEEE Journal of Solid State Circuits*, vol. 27, 618–25, (1992).

Rabaey, *Digital Integrated Circuits*, Prentice Hall, Englewood Cliffs, NJ, 222–232, (1996).

(List continued on next page.)

*Primary Examiner*—Minh Loan Tran
*Attorney, Agent, or Firm*—Schwegman, Lundberg, Woessner & Kluth, P.A.

[57] ABSTRACT

An improved structure and method for gated lateral bipolar transistors is provided. The present invention capitalizes on opposing sidewall structures and adjacent conductive sidewall members to conserve available surface space on the semiconductor chips. The conserved surface space allows a higher density of structures per chip. The conductive sidewall members couple to the gate of the gated lateral bipolar transistor and, additionally, to a retrograded, more highly doped bottom layer. The improved structure provides for both metal-oxide semiconductor (MOS) type conduction and bipolar junction transistor (BJT) type conduction beneath the gate of the gated lateral bipolar transistor.

16 Claims, 12 Drawing Sheets

U.S. PATENT DOCUMENTS

| | | | |
|---|---|---|---|
| 5,585,998 | 12/1996 | Kotecki et al. | 361/321.4 |
| 5,646,900 | 7/1997 | Tsukude et al. | 365/205 |
| 5,680,345 | 10/1997 | Hsu et al. | 365/185.01 |
| 5,691,230 | 11/1997 | Forbes | 437/62 |
| 5,796,143 | 8/1998 | Fulford, Jr. et al. | 257/330 |
| 5,796,166 | 8/1998 | Agnello et al. | 257/751 |
| 5,892,260 | 4/1999 | Okumura et al. | 257/347 |

OTHER PUBLICATIONS

Saito, M., et al., "Technique for Controlling Effective Vth in Multi–Gbit DRAM Sense Amplifier", *1996 Symposium on VLSI Circuits, Digest of Technical Papers*, Honolulu, HI, 106–107, (Jun. 13–15, 1996).

Seevinck, E., et al., "Current–Mode Techniques for High–Speed VLSI Circuits with Application to Current Sense Amplifier for CMOS SRAM's", *IEEE Journal of Solid–State Circuits*, 26, 525–536, (Apr. 1991).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Tuinega, *A Guide to Circuit Simulation and Analysis Using PSPICE*, Prentice Hall, Englewood Cliffs, NJ, (1988).

Wong, et al., "A IV CMOS Digital Circuits with Double–Gate Driven MOSFET", *IEEE Int. Solid State Circuits Conference*, San Francisco, 292–93, (1997).

Chen, M.J., et al., "Back–Gate Forward Bias Method for Low–Voltage CMOS Digital Circuits", *IEEE Transactions on Electron Devices*, 43, 904–909, (Jun. 1986).

Chen, M.J., et al., "Optimizing the Match in Weakley Inverted MOSFET's by Gated lateral Bipolar Action", *IEEE Transactions on Electron Devices*, 43, 766–773, (May 1996).

Chung I.Y., et al., "A New SOI Inverter for Low Power Applications", *Proceedings of the 1996 IEEE International SOI Conference*, Sanibel Island, FL, 20–21, (Sep. 30–Oct. 3, 1996).

Holman, W.T., et al., "A Compact Low Noise Operational Amplifier for a 1.2 MIcrometer Digital CMOS Technology", *IEEE Journal of Solid–State Circuits*, 30, 710–714, (Jun. 1995).

Huang, W.L., et al., "TFSOI Complementary BICMOS Technology for Low Power Applications", *IEEE Transactions on Electron Devices*, 42, 506–512, (Mar. 1995).

Ko, et al., "High–gain Lateral Bipolar Action in a MOSFET Structure", *IEEE Trans. on Electron Devices*, vol. 38, No. 11, 2487–96, (Nov. 1991).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Parke, S.A., et al., "A High–Performance Lateral Bipolar Transistor for Microprocessor–Based Smart Power Applications", *IEEE Transactions on Electron Devices*, 42, 564–570, (Mar. 1995).

STRUCTURE FOR GATED LATERAL BIPOLAR TRANSISTORS

RELATED APPLICATIONS

This application is related to the following co-filed and commonly assigned applications; attorney docket number 303.413usl, entitled "Circuit and Method for Low Voltage, Voltage Sense Amplifier," attorney docket number 303.402usl, entitled "Circuit and Method for Low Voltage, Current Sense Amplifier," and attorney docket number 303.471usl, entitled "Circuit and Method for Gate-Body Structures in CMOS Technology," which are hereby incorporated by reference.

FIELD OF THE INVENTION

The present invention relates generally to semiconductor integrated circuits. More particularly, it pertains to the structure and fabrication of gated lateral bipolar transistors.

BACKGROUND OF THE INVENTION

Integrated circuit technology relies on transistors to formulate vast arrays of functional circuits. The complexity of these circuits require the use of an ever increasing number of linked transistors. As the number of transistors required increases, the surface area on a silicon chip/die that can be dedicated to a single transistor dwindles. It is desirable then, to construct transistors which occupy less surface area on the silicon chip/die.

Integrated circuits are predominantly designed with one of two types of transistors. These two types are metal-oxide semiconductor (MOS) transistors and bipolar junction transistors (BJTs). MOS transistors are prevalent in integrated circuit technology because they generally demand less power than their counterpart, bipolar transistors. Bipolar transistors, on the other hand, also possess certain advantages over MOS transistors, such as speed. Therefore, attempts have been made to combine the technological designs of bipolar transistors and MOS transistors in an effort to maximize the benefits of both transistor types.

Various types of lateral MOS transistors have been historically described and utilized in complementary metal oxide semiconductor (CMOS) technology. Lateral bipolar transistors have received renewed interest with the advent of bipolar complementary metal oxide semiconductor (BiCMOS) technologies. Recently newer devices have been developed which have both MOS and bipolar characteristics and functionality. A more careful distinction is made between the different types of transistor action possible in the newer devices. These newer devices include the so-called "gate-body" connected MOS transistor and the "gated lateral" bipolar transistor. The term gate-body connected transistors is used to describe vertical or other device structures where the body of the MOS transistor also serves as the base of a bipolar transistor but each device functions separately as a normal transistor and MOS transistor action is dominant. A voltage applied to the gate region of the structure is also directly input into the body of the semiconductor material. This results in reducing the threshold voltage of the MOS transistor.

In a gated lateral transistor, not only the structures but also the operation is merged and most current flows along the surface under the gate in either MOS or bipolar operation. At low gate voltages around threshold ($V_t$), the gated lateral bipolar transistors can act as gate-body connected MOS transistors. At higher input voltages, $V_t$ or more, the bipolar action can dominate and they are more appropriately described as gated lateral bipolar transistors.

One problem with conventional designs of gate-body and gated lateral transistors is that they use up precious die space in the fabrication of integrated circuits. What is needed is a structure which can offer merged transistor action, yet also conserve space on the chip's surface. Structures which conserve space contribute toward higher density fabrication, and increased utility for integrated circuits. It is desirable that any improved configuration for transistor structure be adaptable to present integrated circuit design. Thus, it is an objective to uncover newly configured transistors which conserve chip space and which can be employed in conventional digital circuit technology.

SUMMARY OF THE INVENTION

In one embodiment, a gated lateral bipolar transistor is provided. The gated lateral bipolar transistor is a single crystalline semiconductor structure. The structure has an upper surface and opposing sidewall surfaces. The single crystalline semiconductor structure has a retrograded and more highly doped bottom layer/well. There is a source/emitter region and a collector/drain region on the upper surface. A dielectric layer is formed on the upper surface as well as on the opposing lower sidewall surfaces of the single crystalline semiconductor structure. A gate is located above the dielectric layer, above the upper surface of the single crystalline semiconductor structure. Conductive sidewall members are included which couples to the gate. This sidewall member additionally couples to the opposing sidewall surfaces. The gated lateral bipolar transistor gives both BJT and MOS action.

In another embodiment, a gated lateral bipolar transistor is formed on a semiconductor substrate. The transistor has a first layer of semiconductor material extending outwardly from the substrate. The first layer of semiconductor material includes an upper surface and has opposing sidewall surfaces. There is a second layer of semiconductor material formed on and extending outwardly from the upper surface of the first layer of semiconductor material. Like the first layer of semiconductor material, the second layer of semiconductor material has opposing sidewall surfaces and an upper surface. On its upper surface, the second layer of semiconductor material has a source/emitter region and a collector/drain region. A dielectric layer is formed over the upper surface of the second layer of semiconductor material and also over the opposing sidewall surfaces of both the first and second layers of semiconductor material. A gate is formed on this dielectric layer. And, a conductive sidewall member is disposed adjacent to portions of the dielectric layer. The conductive sidewall member also couples to portions of the first layer of semiconductor materials.

In another embodiment, the gated lateral bipolar transistor is formed on an insulator layer formed on a p+ silicon material substrate. A first layer of semiconductor material extends outwardly from the insulator layer and has opposing sidewall surfaces and an upper surface. A second layer of semiconductor material extends outwardly from the upper surface of the first layer of semiconductor material along with opposing sidewall surfaces. An upper surface of the second layer of semiconductor material is provided with a source/emitter region and a collector/drain region. A dielectric layer formed on the upper surface of this second layer of semiconductor material, and likewise on the opposing sidewall surfaces of both the first and second layers of semiconductor material. There is again a gate formed on the dielectric layer. Conductive sidewall members are disposed adjacent to the opposing sidewall surfaces. The conductive sidewall members additionally couple to the gate. The conductive sidewall members have electrical contact to portions of the first layer of semiconductor material. In this embodiment, the insulator layer is formed of an oxide layer, and the first layer of semiconductor material is more highly doped than the second layer of semiconductor material. The conductive sidewall members are formed of polysilicon. This gated lateral bipolar transistor gives both BJT and MOS action beneath the gate and is adapted to operate at a voltage input no greater than 1.5 volts.

The present invention also provides a method of fabrication for a gated lateral bipolar transistor. In one embodiment, the method of fabrication includes forming a planar body that extends outwardly from a semiconductor substrate. The planar body is formed to include a top surface and a pair of sidewalls. A dielectric layer is formed on the top surface as well as on the pair of sidewalls. A gate is then formed on the dielectric layer. Forming the gate includes disposing the gate adjacent to the top surface and to the pair of sidewalls of the planar body. A source/emitter region is implanted into the top surface of the planar body. A drain/collector region is also implanted into the top surface. The method of fabricating the gated lateral bipolar transistor includes providing for both bipolar junction transistor (BJT) and metal-oxide semiconductor (MOS) type conduction in the planar body. The method includes forming the planar body to have a retrograded well of highly doped silicon material. The method of fabrication further includes adapting the gated lateral transistor to operate with voltage input if no greater than 1.5 volts.

Another method of fabricating a gated lateral bipolar transistor includes forming a first layer of semiconductor material that extends outwardly from a semiconductor substrate. A second layer of semiconductor material is formed on the first layer of semiconductor material. The second layer of semiconductor material is formed to include a source/emitter region and a collector/drain region. The method includes forming an first insulator layer on the second layer of semiconductor material and forming a second insulator layer underneath the first layer of semiconductor material. A gate is formed on the second insulator layer and around portions of the first and second layers of semiconductor material. The gate is formed to couple to portions of the first layer of semiconductor material. This method includes forming the first and second layers of semiconductor material of differently doped silicon material.

Another embodiment for fabricating a gated lateral bipolar transistor includes forming a first body type to extend outwardly from a semiconductor substrate. The first body type is formed with a top surface and opposing sidewall surfaces. The method includes forming a second body type on top of the first body type. The second body type is similarly formed to have a top surface and opposing sidewall surfaces. The second body type is also formed with a source/emitter region and a collector/drain region. In this method, a first insulator layer is formed on the upper surface of the second body type and on portions of the opposing sidewall surfaces of the first and second body types. A second insulator layer is formed between the first body type and the semiconductor substrate. The method further includes forming a gate over the first insulator layer above the top surface of the second body type. Conductive sidewall members are formed and coupled to the gate. The method also includes coupling the conductive sidewall members to the first layer of semiconductor material.

Thus, an improved structure and method for fabricating gated lateral bipolar transistors is provided. The present invention capitalizes on opposing sidewall structures and adjacent conductive sidewall members to conserve available surface space on the semiconductor chips. Conservation of surface space achieves a higher density of surface structures per chip.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 2A–2K illustrate an embodiment of the various processing steps for fabricating a complementary pair of gated lateral bipolar transistors.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form an integrated circuit (IC) structure using the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Structure

Figure 1A:
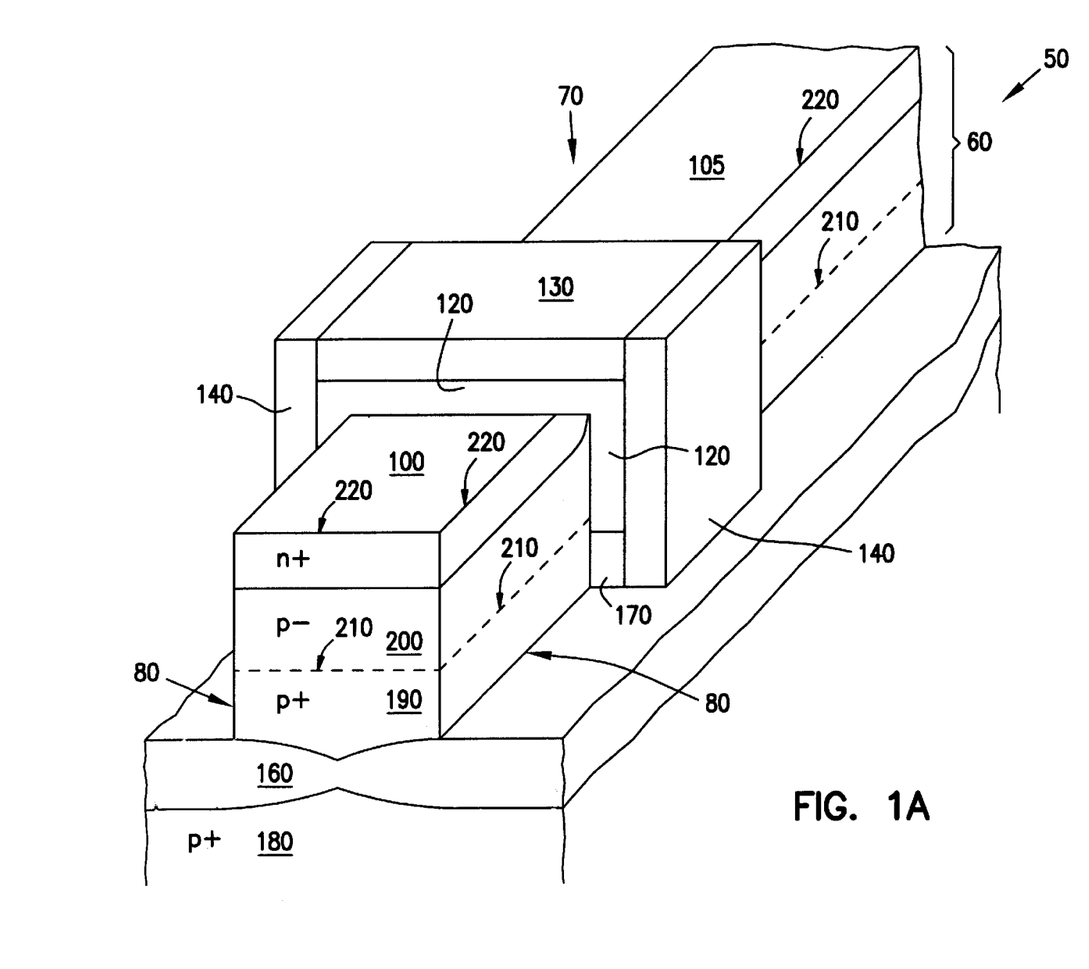
FIG. 1A is a perspective view of an embodiment of the gated lateral bipolar transistor according to the teachings of the present invention.

FIG. 1A is a perspective view illustrating one embodiment of a gated lateral bipolar transistor 50, according to the teachings of the present invention. FIG. 1A illustrates that the gated lateral bipolar transistor 50 has a single crystalline semiconductor structure 60. The single crystalline semiconductor structure 60 has an upper surface 70, opposing sidewall surfaces 80, and a bottom layer 190. The single crystalline semiconductor structure 60 has a source/emitter region 100 and a collector/drain region 105 on the upper surface 70. A dielectric layer 120 is formed on the upper surface 70 and the opposing sidewall surfaces 80 of the single crystalline semiconductor structure 60. A gate 130 is formed on the dielectric layer 120. Conductive sidewall members 140 couple to the gate 130. The conductive sidewall members further couple to the opposing sidewall surfaces 80 on the bottom layer 190 via conductive contacts 170. The bottom layer 190 forms a retrograded, more highly doped, well or bottom layer to the single crystalline semiconductor structure 60. In one embodiment, the retrograded bottom layer 190 of the single crystalline semiconductor structure 60 is formed of p+ silicon material. In an alternative embodiment, the retrograded bottom layer 190 of the single crystalline semiconductor structure 60 is formed of n+ silicon material. The gated lateral bipolar transistor 50 is formed on an insulator layer 160 which is itself formed on a p+ silicon substrate 180.

Figure 1B:
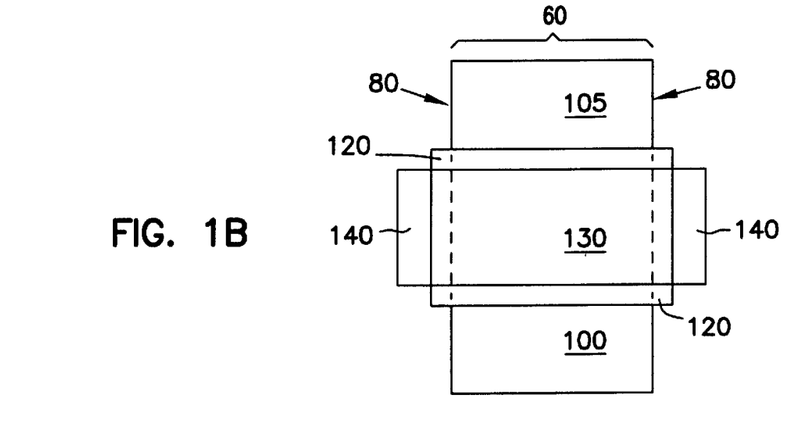
FIG. 1B is a top view of an embodiment of the gated lateral bipolar transistor shown in FIG. 1A.

FIG. 1B provides a top view of the structure shown in FIG. 1A. The figure in 1B illustrates the source/emitter region 100 and the collector/drain region 105. FIG. 1B also illustrates the gate 130 resting on the dielectric layer 120. Also shown in FIG. 1B are the conductive sidewall members 140 which couple to the opposing sidewall surfaces 80 of the single crystalline semiconductor structure 60.

Figure 1C:
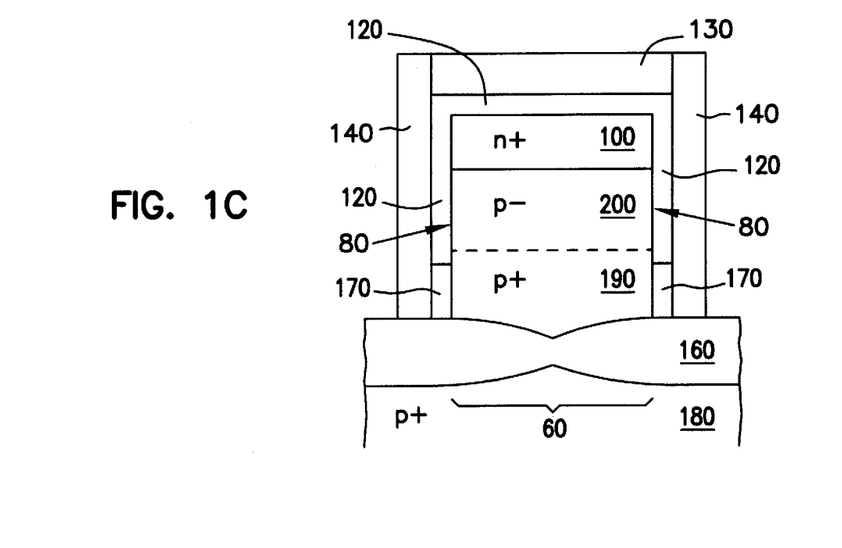
FIG. 1C is an end view of an embodiment of the gated lateral bipolar transistor shown in FIG. 1A.

FIG. 1C provides an end view of the structure shown in FIG. 1A. Included in FIG. 1C is the retrograded bottom layer 190 of the single crystalline semiconductor structure 60. The end view of FIG. 1C similarly illustrates the gate region 130 formed on the dielectric layer 120. FIG. 1C illustrates the conductive sidewall members 140 coupling to the opposing sidewall surfaces 80 at the bottom layer region 190 of the single crystalline silicon semiconductor structure 60 via conductive contacts 170. In one embodiment, the gate 130 and the conductive sidewall members 140 are independently formed materials. In an alternative embodiment, the gate 130 and the conductive sidewall members 140 are one continuous structure.

In another embodiment, also exemplified by FIG. 1A, the single crystalline semiconductor structure 60 of the gated lateral bipolar transistor 50 includes a first layer of semiconductor material 190 and a second layer of semiconductor material 200. The first layer of semiconductor material 190 extends outwardly from an insulator layer 160. The first layer of semiconductor material 190 has opposing sidewall surfaces 80 and an upper surface 210. The second layer of semiconductor material 200 extends outwardly from the upper surface 210 of the first layer of semiconductor material 190. The second layer of semiconductor material 200 also includes opposing sidewall surfaces 80 and has an upper surface 220. The second layer of semiconductor material 200 includes a source/emitter region 100 and a collector/drain region 105. A dielectric layer 120 is formed on the upper surface of the second layer of semiconductor material 200, as well as on the opposing sidewall surfaces 80 of the first and second layers of semiconductor material, 190 and 200 respectively. A gate 130 is formed on the dielectric layer 120. Conductive sidewall members are disposed adjacent to portions of the dielectric layer 120 on the opposing sidewall surfaces 80 of the first and second layers of semiconductor material, 190 and 200 respectively. The conductive members 140 couple to portions of the first layer of semiconductor material 190 via conductive contacts 170.

In one embodiment, the first layer of semiconductor material 190 of the gated lateral bipolar transistor 50 is a first conductivity type and the second layer of semiconductor material 200 is of the same conductivity type. The substrate is formed of p+ silicon material. The first layer of semiconductor material 190 is a p+ silicon material. In an alternative embodiment, the first layer of semiconductor material is an n+ silicon material. The conductive sidewall members have conductive contacts 170 to the first layer of semiconductor material 190.

Operation

The operation of the gated lateral bipolar transistor 50 is given by applying a potential to the gate 130. Applying potential to the gate 130 creates an inversion region in the second layer of semiconductor material 200 of the single crystalline semiconductor structure 60. The inversion region allows conduction between the source/emitter region 100 and the collector/drain region 105. The conduction occurs along the upper surface 220 of the second layer of semiconductor material 200. At low values of applied potential close to the threshold potential ($V_t$) the gated lateral bipolar transistor 50 exhibits metal oxide semiconductor (MOS) conduction action. In the exemplary embodiment, the gated lateral bipolar transistor operates at a voltage input of no greater than 1.5 volts. For greater applied potentials larger than $V_t$, the gated lateral bipolar transistor 50 exhibits bipolar junction transistor (BJT) conduction action in addition to the MOS conduction action. For even higher applied potentials much greater than $V_t$, the BJT conduction action dominates. At the higher applied potential levels, the bipolar junction transistor conduction action results from the applied potential being injected directly into the first layer of semiconductor material 190. In both the BJT and MOS conduction modes, the conduction occurs in the upper surface 220 of the second layer of semiconductor material 200 beneath the gate 130.

Method of Fabrication

Figure 2A:
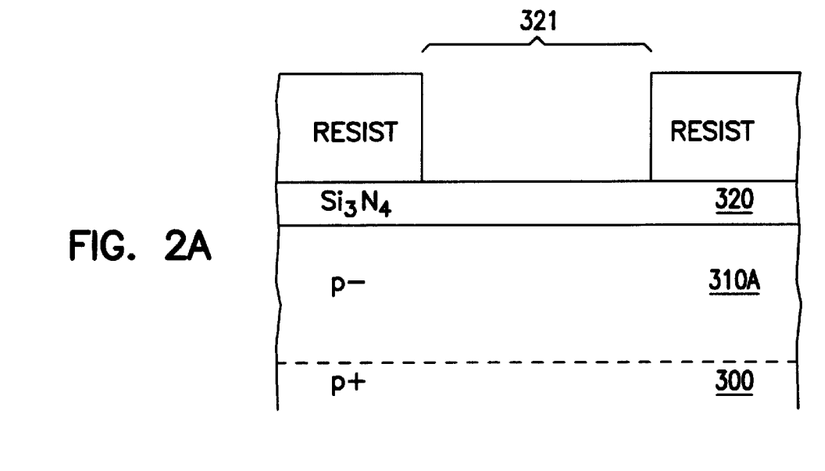

FIGS. 2A through 2K illustrate an embodiment of the various processing steps for fabricating a complementary pair of gated lateral bipolar transistors. FIG. 2A begins with a p+ doped silicon substrate 300. A p– layer 310 is grown directly on the p+ layer 300. The p– layer 310 is epitaxially grown to a thickness of approximately 0.5 micrometers ($\mu$m). Next, a nitride layer 320, formed of silicon nitride ($Si_3N_4$), is deposited on the p– layer 310. The nitride layer 320 can be deposited through any suitable process, such as chemical vapor deposition (CVD). A photo resist is applied and selectively exposed to provide a mask to define a p–channel metal oxide semiconductor (PMOS) device region 321. The nitride layer 320 is etched through a process such as reactive ion etching (RIE) to expose the silicon material underneath.

Figure 2B:
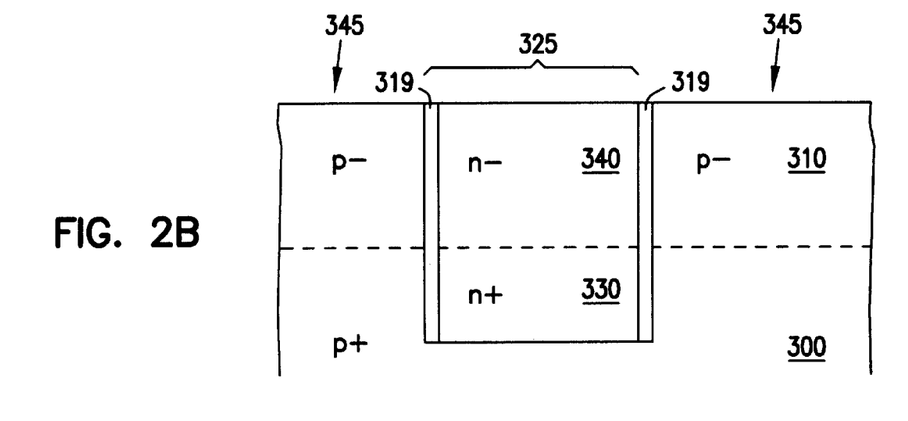

FIG. 2B illustrates the structure after the next series of steps. The p– silicon layer 310 and the p+ silicon layer 300 are etched to a depth of approximately 0.7 $\mu$m to form a trench 325. An oxide layer 319 is formed and directionally etched to leave on the vertical sidewalls of the trench 325 created by the previous etching step. In one embodiment, the oxide layer 319 is grown, such as through thermal oxidation. In an alternative embodiment, the oxide is deposited through any suitable process, such as chemical vapor deposition (CVD). The oxide layer 319 is etched through the process of reactive ion etching (RIE). An n+ layer 330 is formed within the trench 325. In one embodiment, the n+ layer 330 is grown to a thickness of approximately 0.2 $\mu$m through the process of epitaxial growth. In an alternative embodiment, the n+ layer 330 is begun with intrinsic epitaxial growth, followed by ion implantation of the n+ silicon material. Next, an n– layer 340 is formed on the surface of the n+ layer 330. The n– layer 340 is grown to a thickness of approximately 0.5 μm, sufficient to fill trench 325 to the same level as the original upper surface 345 of the p– silicon layer 310. The nitride layer 320 is stripped and the upper surface 345 is planarized through any suitable process. In one embodiment, the upper surface 345 is planarized through the process of chemical mechanical polishing/planarization (CMP). The structure is now as shown in FIG. 2B.

Figure 2C:
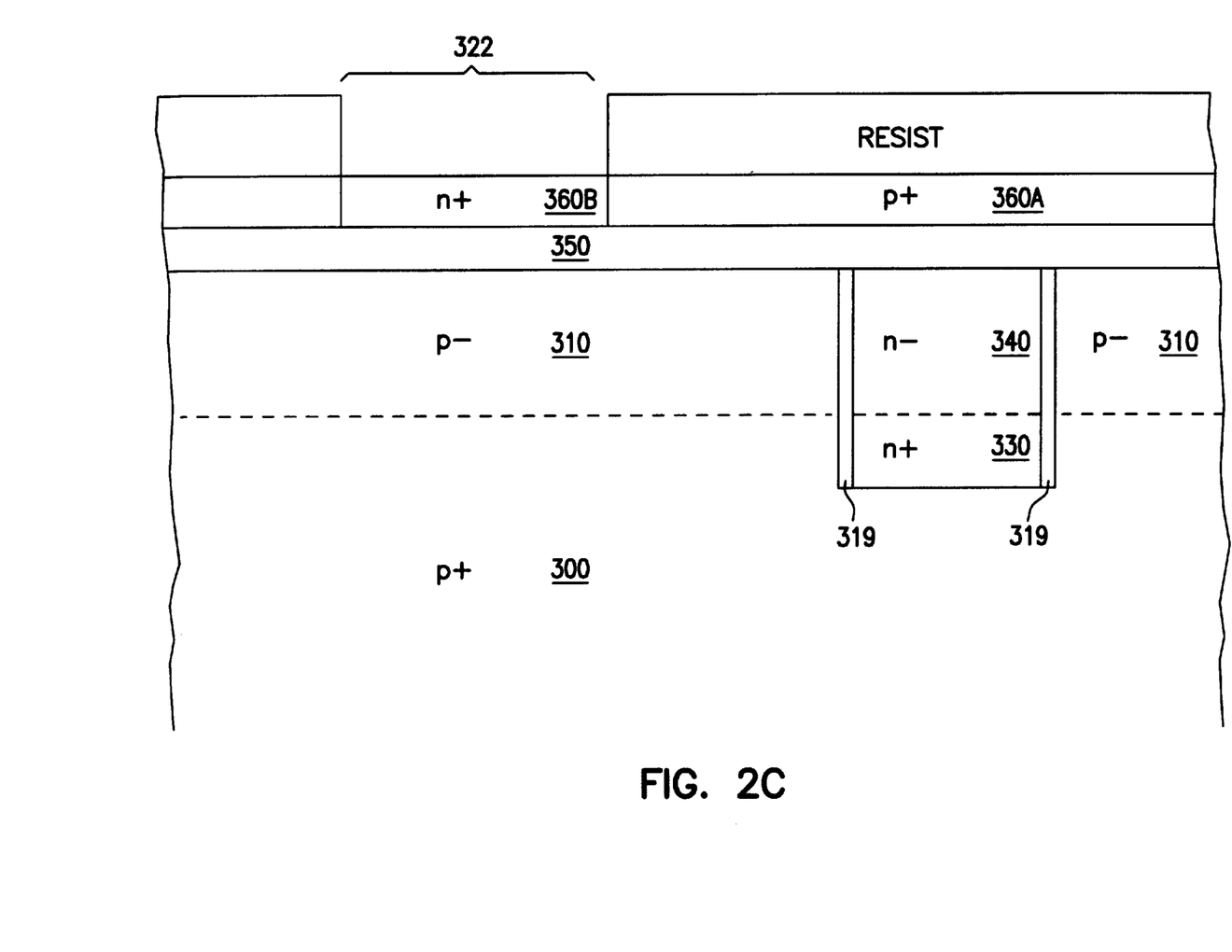

FIG. 2C represents the structure following the next sequence of processing steps. An oxide layer 350 is formed on and across the upper surface 345 of the p– layer 310 and the n– layer 340. A p+ polysilicon gate material 360A is deposited across the surface of the oxide layer 350. The p+ layer 360A is formed to a thickness of approximately 0.2 μm. The p+ gate material 360A can be deposited through any suitable method, such as through chemical vapor deposition (CVD). A photoresist is applied and selectively exposed to provide a mask-defining an n– channel metal oxide semiconductor (NMOS) device region 322. An n+ gate material 360B is formed in the NMOS device region 322 through a process such as ion implantation of n-type impurity ions. The structure is now as appears in FIG. 2C.

Figure 2D:
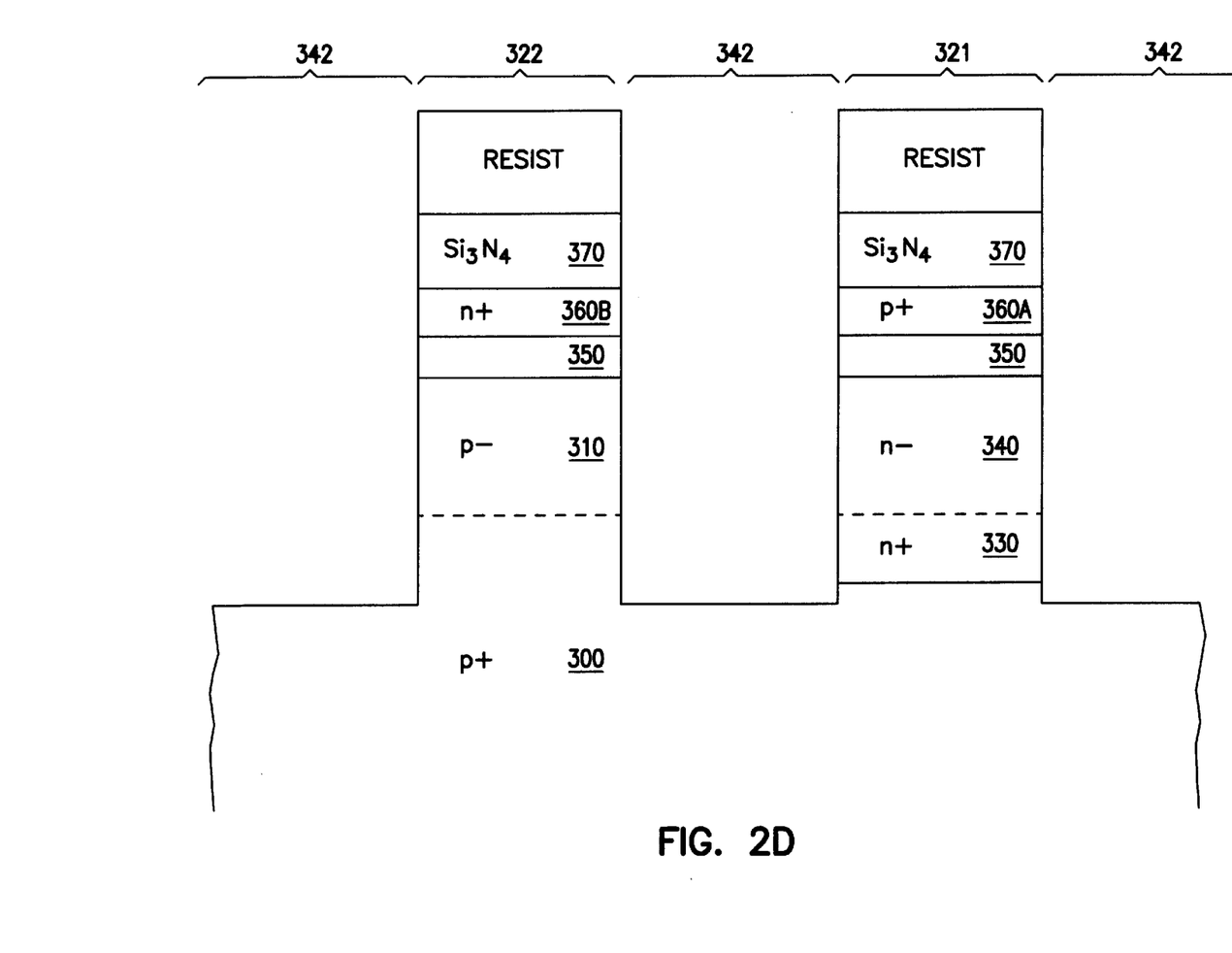

FIG. 2D illustrates the structure after the next sequence of processing steps. The photoresist has been stripped, using conventional photoresist stripping techniques. A nitride pad 370 is formed on and across the surface of the n+ gate material 360B and the p+ gate material 360A. The nitride pad 370 is deposited by any suitable process, such as by chemical vapor deposition (CVD). The nitride pad is deposited to a thickness of approximately 0.4 μm. A photoresist is applied and selectively exposed to provide a mask which defines and covers the PMOS and NMOS device regions, 321 and 322 respectively. The nitride cap 370 in between device regions, 321 and 322, is removed. The nitride cap 370 is removed by any suitable etching technique, such as by RIE. The p+ gate material 360A in between device regions, 321 and 322, is removed. And, the gate oxide 350 in between device regions, 321 and 322, is removed. Each of these materials can be removed by etching using the RIE technique.

Still using the photoresist as a mask, the etching process is continued into the p– layer 310 and the p+ layer 300 of the silicon to a depth of approximately 0.2 μm below the bottom of the n+ layer 330. The etching is performed through any suitable process, such as by RIE. These etching steps leave trenches 342 between the device regions 321 and 322. The structure is now as shown in FIG. 2D. The photoresist is next stripped, using conventional photoresist stripping techniques.

Figure 2E:
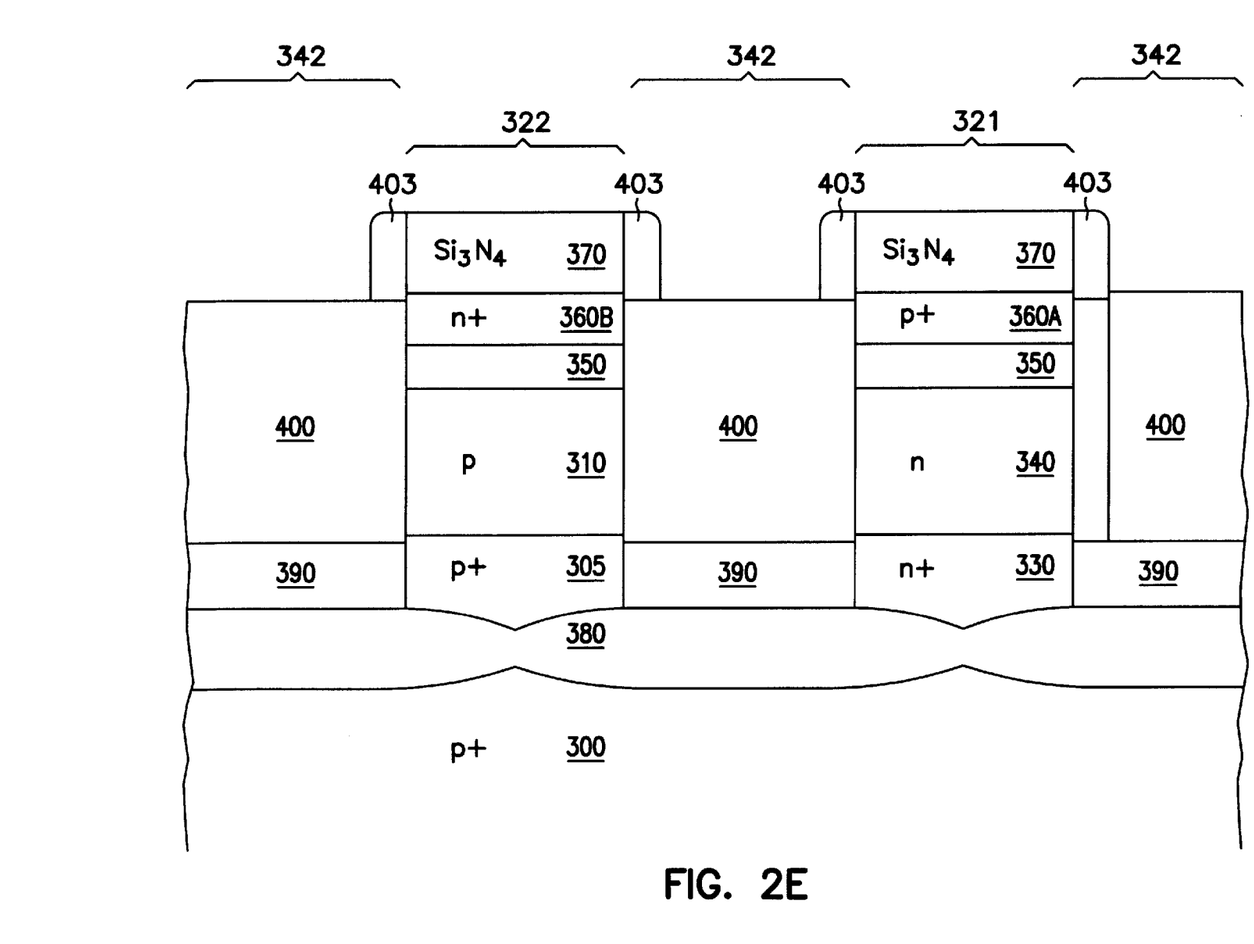

FIG. 2E illustrates the structure after the next series of processing steps. An insulator layer 380 is formed beneath the device regions, 321 and 322 respectively. The insulator layer 380 is formed using silicon on insulator (SOI) processing techniques. One skilled in the art will recognize that there exist various approaches to forming an insulator layer underneath active device regions. The insulator layer 380 is formed using, for example, the techniques of U.S. application Ser. No. 08/745,708, entitled *Silicon-On-Insulator Islands and Method for Their Formation* (the '708 Application), or U.S. Pat. No. 5,691,230, entitled *Technique for Producing Small Islands of Silicon on Insulator* (the '230 Patent). The '708 Application and the '230 Patent are incorporated by reference.

Another method or approach is known as silicon insulated metal-oxide (SIMOX). This method creates a blanket buried oxide layer within the starting substrate. Any suitable technique may be used, and since such a process is not part of the present invention, these steps are not recited. Intrinsic polysilicon 390 is deposited by any suitable methods, such as by CVD, to fill the trenches 342. Next, the trenches 342 are planarized stopping on the nitride pads 370. The intrinsic polysilicon 390 in trenches 342 can be planarized by any suitable process, such as by chemical mechanical polishing/planarization (CMP). The intrinsic polysilicon is directionally etched back to leave approximately 0.1–0.2 μm at the bottom of the trenches 342. The etch can be performed using any suitable method such as reactive ion etching (RIE). Oxide spacer 400 is deposited such as by CVD to fill trenches 342. The oxide spacer 400 is etched back to approximately 0.4 μm to the level of the top of the gates, 360A or 360B. A nitride spacer 403 is deposited such as by CVD. The nitride spacer 403 is directionally etched to leave on the exposed vertical sidewalls of the nitride pads 370. The structure is now as shown in FIG. 2E.

Figure 2F:
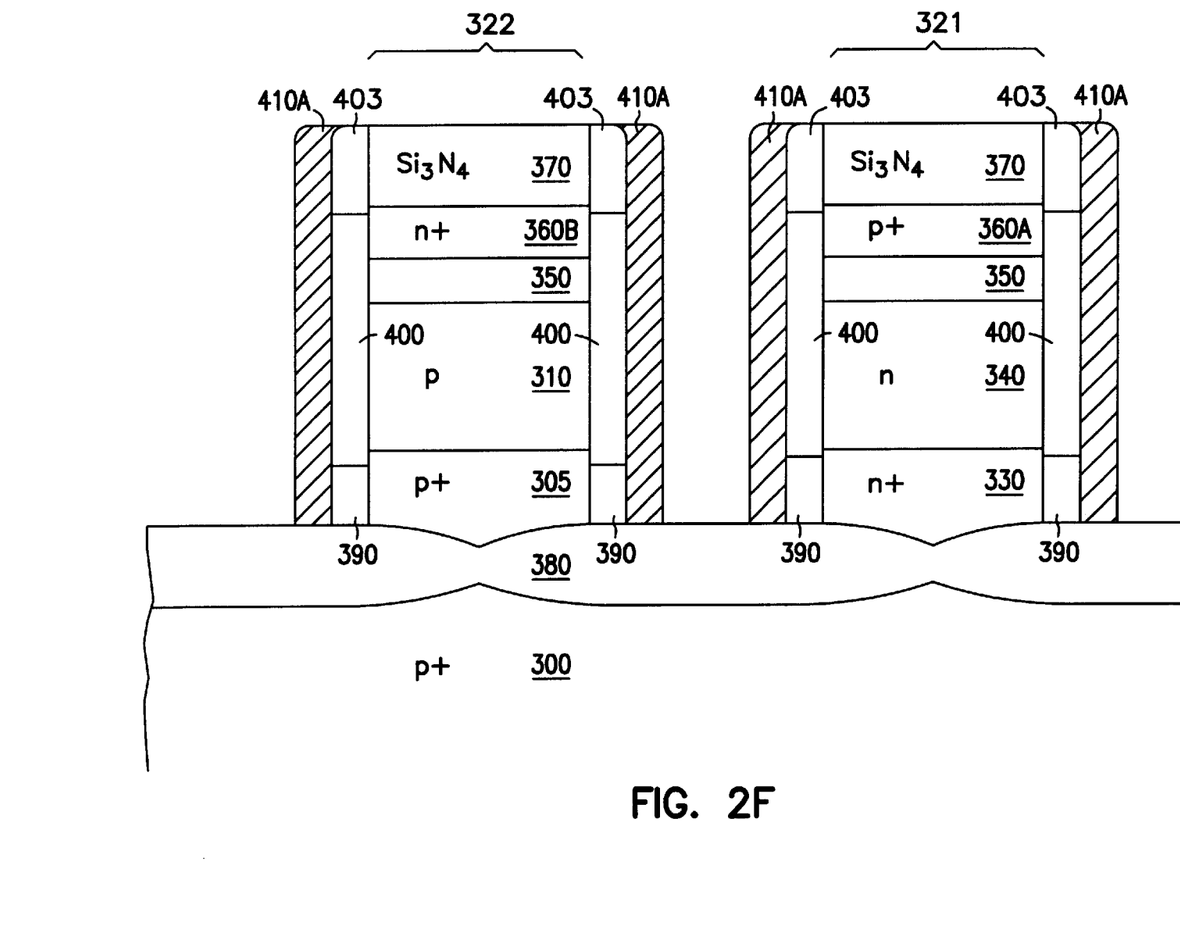
Figure 2G:
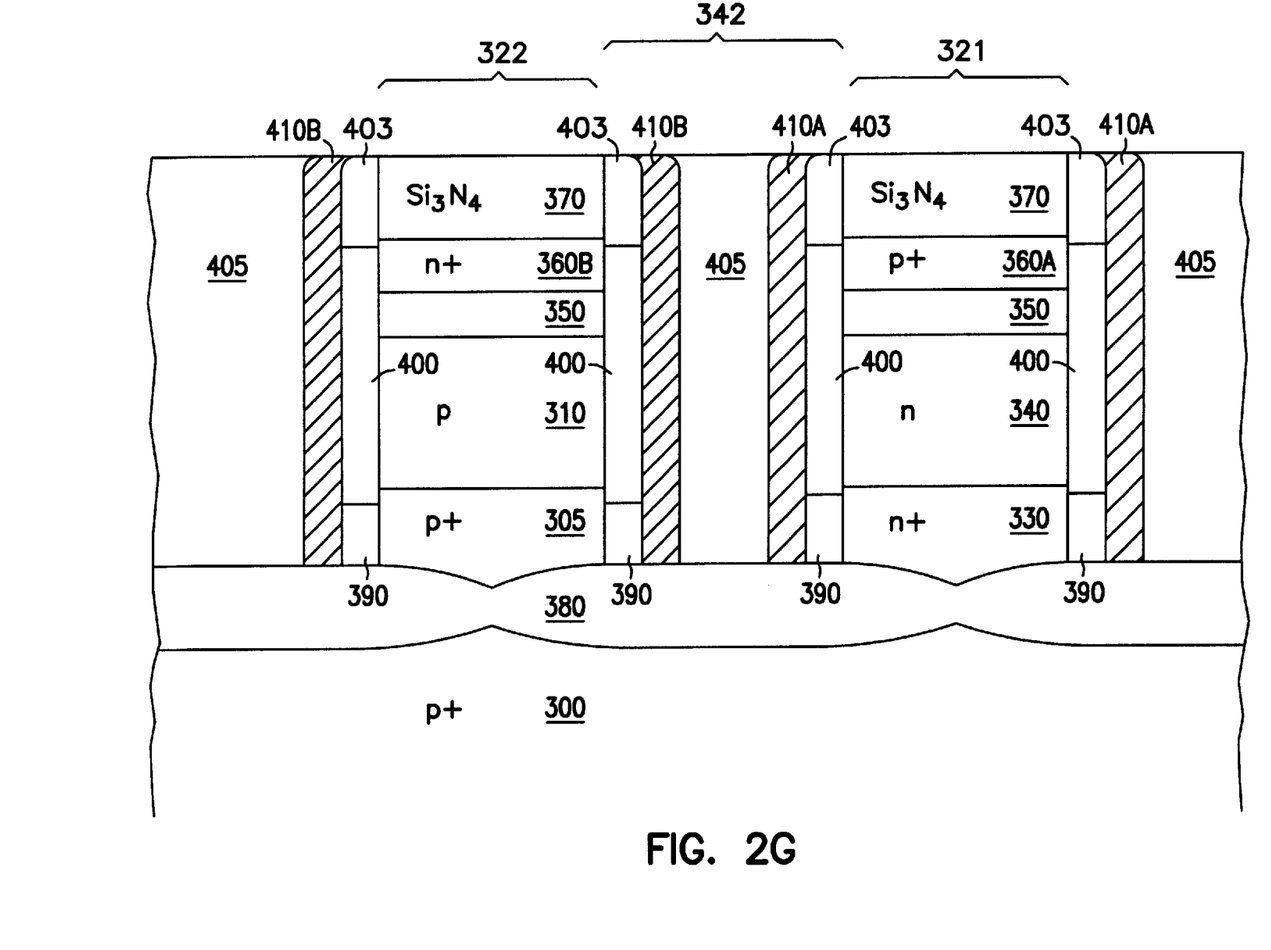

FIG. 2F illustrates the structure following the next sequence of process steps. The oxide 400 and intrinsic polysilicon 390 are directionally etched using the nitride spacer 403 overhang as a mask. An n+ polysilicon layer 410A is deposited by CVD. The n+ polysilicon 410A is etched, such as by reactive ion etching, to leave on the vertical sidewalls of the oxide spacer 400. The n+ polysilicon layer 410A serves as the conductive sidewall members for the PMOS device region 321. The structure is now as shown in FIG. 2F FIG. 2G illustrates the structure after the next sequence of process steps. Silicon dioxide 405 is deposited in the trenches 342 and then planarized using CMP. The silicon dioxide 405 may be deposited by any suitable method, such as by CVD. A photoresist is applied and selectively exposed to reveal only the NMOS device regions 322. The exposed n+ polysilicon 410A is selectively etched to remove from the sidewalls of the NMOS device regions 322. A p+ polysilicon layer 410B is then deposited by CVD to fill the slots left from removal of the n+ polysilicon 410A and is then removed from the top surface by any suitable method, such as RIE or CMP. The p+ polysilicon layer 410B serves as the conductive sidewall members for the NMOS device region 322. The structure is now as shown in FIG. 2G.

Figure 2H:
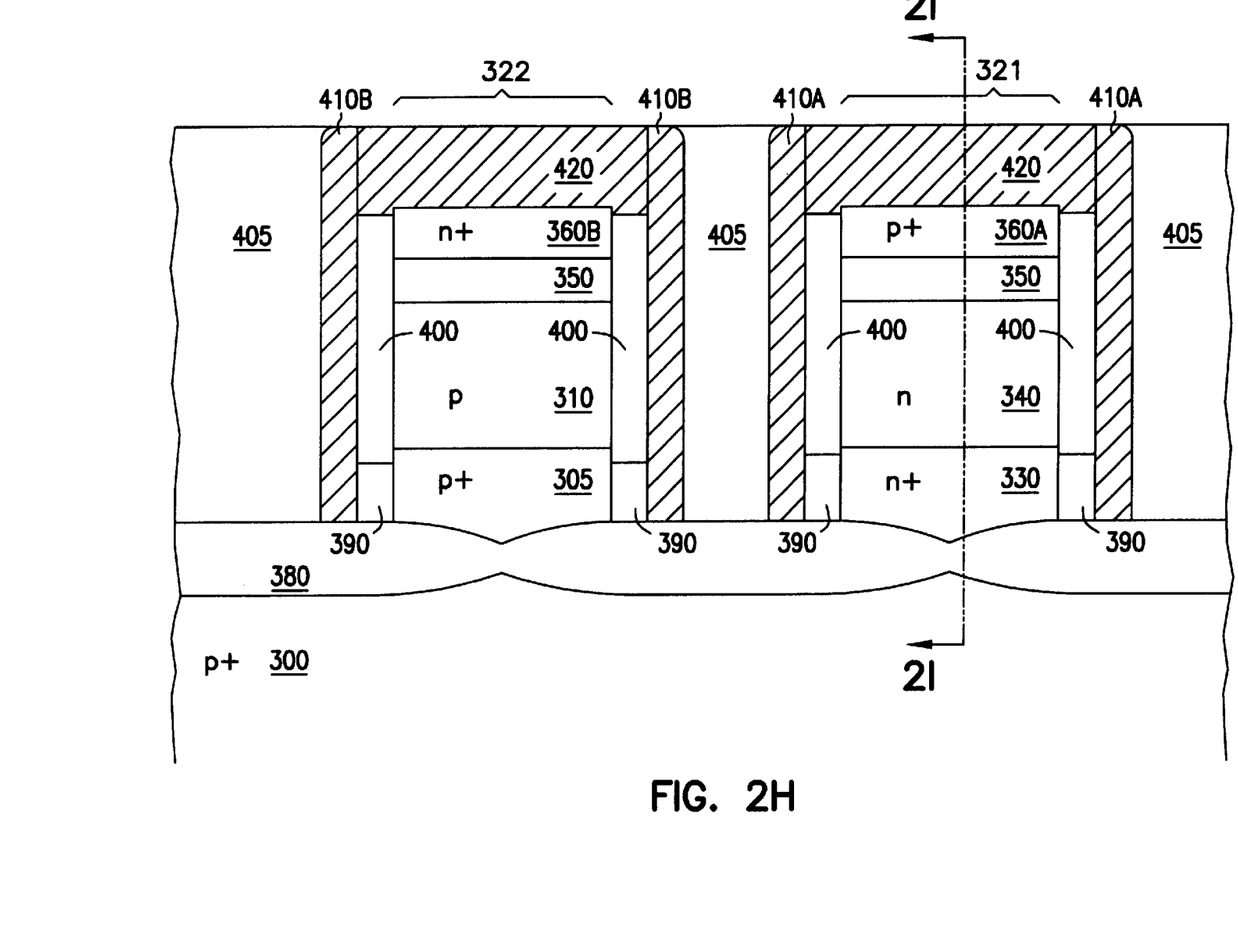

FIG. 2H illustrates the structure following the next sequence of process steps. A phosphoric acid is applied to remove the nitride cap 370 and the nitride spacer 403 from the active device regions, 321 and 322 respectively. Removal of the nitride cap 370 and the nitride spacer 403 exposes the p+ and n+ gate material, 360A and 360B respectively. A gate contact 420 is deposited, such as by CVD, over the p+ and n+ gate regions, 360A and 360B respectively. In one embodiment, the gate contact 420 is formed of tungsten (W). In another embodiment, the gate contact 420 is any other suitable refractory metal. The gate contact 420 is planarized, such as by CMP, such that the gate contact 420 is left only over the p+ and n+ gate regions, 360A and 360B respectively. The device is now as shown in FIG. 2H.

FIG. 2I is a cross sectional view along cut line 2I—2I of FIG. 2H. FIG. 2I illustrates the structure after the following sequence of process steps. A photoresist is applied and selectively exposed to mask the gate regions 344. The exposed gate contact 420 and the n+ or p+ polysilicon gate material, 360B and 360A, are etched to the underlying gate oxide 350. The etching may be performed using RIE.

Figure 2J:
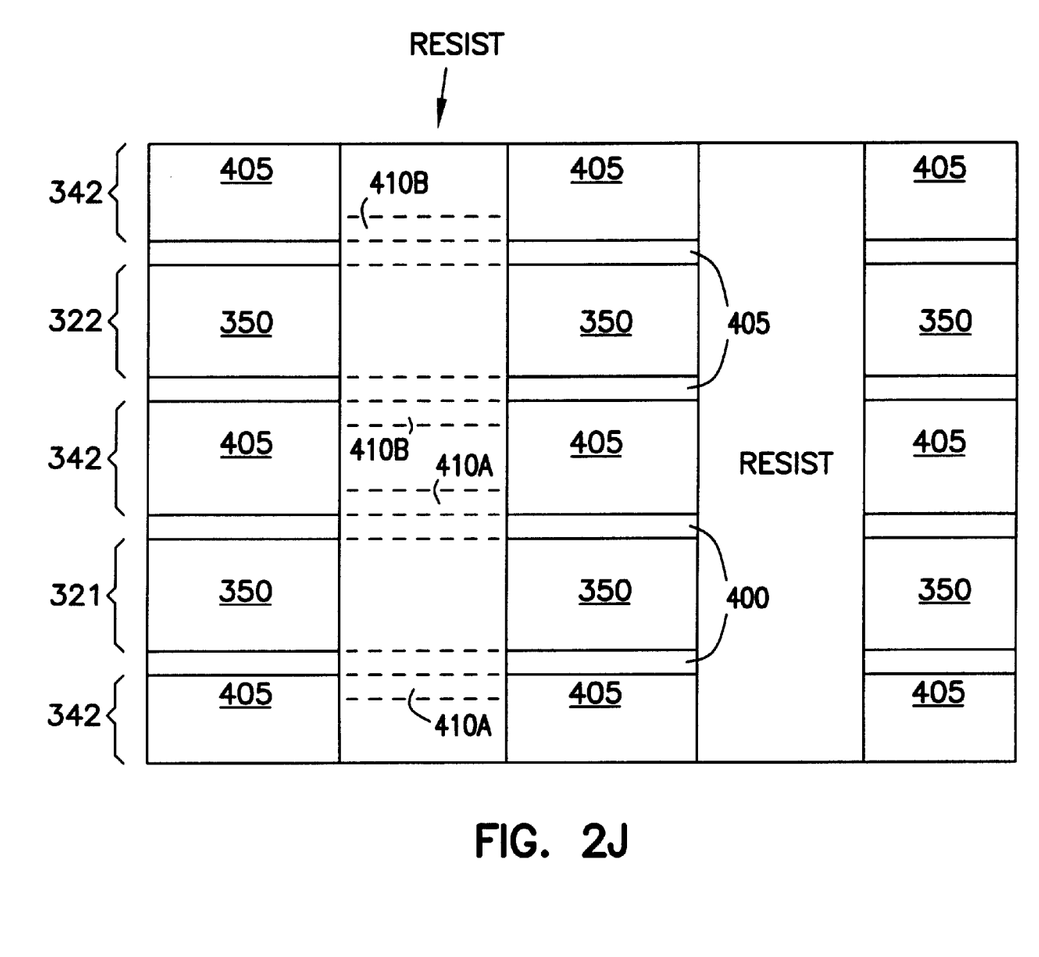

FIG. 2J is a top view of FIG. 2I. Using the same mask, the p+ or n+ polysilicon layers 410B and 410A, located between the device regions 321 and 322, are removed by etching. The etching can be performed using any suitable method, such as RIE.

Figure 2K:
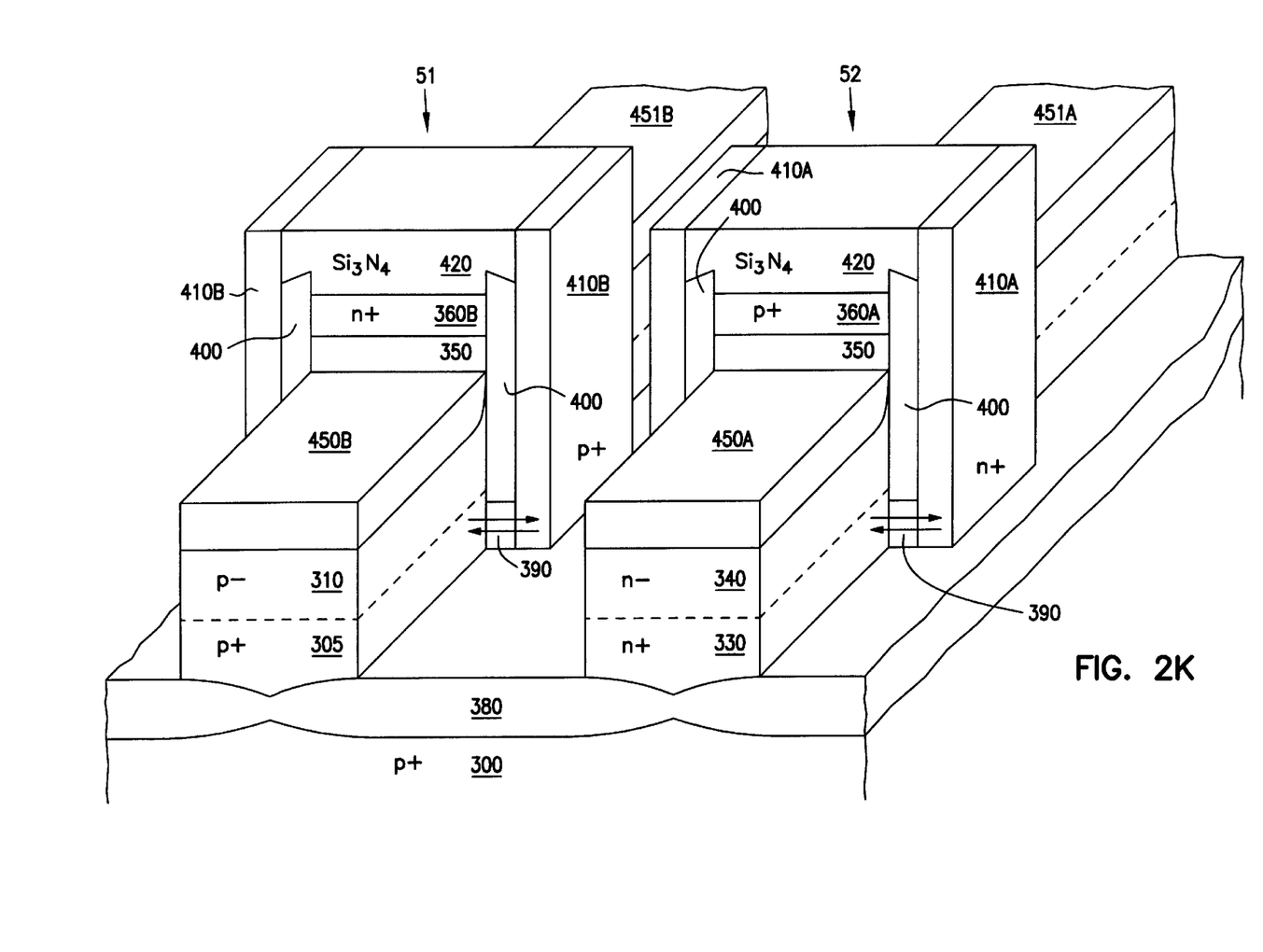

FIG. 2K illustrates the structure following the final series of process steps. The photoresist is removed using conventional photoresist stripping techniques. An anneal is performed to out diffuse boron from the p+ layer 305 and to out diffuse phosphorous (or arsenic) from n+ layer 330. The anneal also serves to out diffuse these same dopants from the p+ and n+ polysilicon layers, 410B and 410A respectively. Hence, the annealing serves to dope the adjoining sandwiched intrinsic polysilicon 390. Boron and phosphorus (or arsenic), respectively, will out diffuse into the intrinsic polysilicon 390 in approximately equal amounts. This process step effectively enhances the thickness of the p+ and n+ polysilicon conductive sidewall members, 410B and 410A respectively.

A photoresist is applied and exposed to cover the NMOS gated lateral bipolar transistor 51. Then, a p+ source/emitter region 450A and a collector/drain region 451A are ion implanted using self-aligning process techniques with the gate 360A. The photoresist is then stripped using conventional photoresist stripping techniques.

Another photoresist is applied and exposed, this time to cover the PMOS gated lateral bipolar transistor 52. Another ion implantation step is used to form an n+ source/emitter region 450B and a collector/drain region 451B in the NMOS gated lateral bipolar transistor 52. The photoresist is once again removed. The structure is now as shown in FIG. 2K.

Contact holes and wiring are achieved through conventional processing steps. One skilled in the art will recognize the method to these steps and, hence, they are not disclosed as part of this application.

Conclusion

An improved structure and method for fabricating gated lateral bipolar transistors is provided. The present invention capitalizes on opposing sidewalls and adjacent conductive sidewall members to conserve available surface space on the semiconductor chips. Conservation of surface space achieves a higher density of surface structures per chip.

It is to be understood that the above description is intended to be illustrative, and not restrictive. Combinations of the above embodiments, and other embodiments will be apparent to those of skill in the art upon reviewing the above description. The above structures and fabrication methods have been described, by way of example, not by way of limitation, with respect to the transistors, gain memory cell, memory cell array and memory device. However, the scope of the invention includes any other integrated circuit applications in which the above structures and fabrication methods are used. Thus, the scope of the invention is not limited to the particular embodiments illustrated and described herein. The scope of the invention should be determined with reference to the appended claims, along with the full scope of equivalents to which such claims are entitled.

What is claimed is:

1. A gated lateral bipolar transistor, comprising:
   a single crystalline semiconductor structure having an upper surface, opposing sidewall surfaces and a bottom layer, the single crystalline semiconductor structure having a source/emitter region and having a collector/drain region on the upper surface;
   a dielectric layer formed on the upper surface and on portions of the opposing sidewall surfaces of the single crystalline semiconductor structure; and
   a gate formed on the dielectric layer above the upper surface and around portions of the opposing sidewall surfaces, the gate coupling to the bottom layer of the single crystalline semiconductor structure, such that the transistor exhibits both bipolar junction transistors (BJT) and metal-oxide semiconductor (MOS) action.

2. The gated lateral bipolar transistor of claim 1, wherein the bottom layer is retrograded and more highly doped than the remainder of the single crystalline semiconductor structure.

3. The gated lateral bipolar transistor of claim 1, wherein the single crystalline semiconductor structure has a bottom layer of p+ silicon material.

4. The gated lateral bipolar transistor of claim 1, wherein the single crystalline semiconductor structure has a bottom layer of n+ silicon material.

5. The gated lateral bipolar transistor of claim 1, wherein the bottom layer of the single crystalline semiconductor structure is formed on an insulator layer formed on a p+ silicon substrate.

6. A gated lateral bipolar transistor, comprising:
   a semiconductor substrate;
   a first layer of semiconductor material extending outwardly from a substrate; the first layer of semiconductor material having opposing sidewall surfaces and an upper surface;
   a second layer of semiconductor material formed on and extending outwardly from the upper surface of the first layer of semiconductor material, the second layer of semiconductor material having opposing sidewall surfaces and an upper surface, and the second layer of semiconductor material having a source/emitter region and collector/drain region;
   a dielectric layer formed on the upper surface of the second layer of semiconductor material and on the opposing sidewall surfaces of the first and second layers of semiconductor material;
   a gate formed on the dielectric layer; and
   conductive sidewall members disposed adjacent to portions of the dielectric layer formed on the opposing sidewall surfaces of the first and second layer of semiconductor materials, and the conductive sidewall members further coupling to portions of the first layer of semiconductor material.

7. The gated lateral bipolar transistor of claim 6, wherein the first layer of semiconductor material is formed on an insulator layer formed on the semiconductor substrate.

8. The gated lateral bipolar transistor of claim 6, wherein the first layer of semiconductor material is a first conductivity type and wherein the second layer of semiconductor material is a second conductivity type.

9. The gated lateral bipolar transistor of claim 6, wherein the semiconductor substrate comprises p+ silicon material.

10. The gated lateral bipolar transistor of claim 6, wherein the gate couples to the conductive sidewall members.

11. The gated lateral bipolar transistor of claim 6, wherein conductive sidewall members make conductive contact to the first layer of semiconductor material.

12. A gated lateral bipolar transistor, comprising:
   a p+ silicon material substrate;
   an insulator layer formed on the substrate;
   a first layer of semiconductor material extending outwardly from the insulator layer; the first layer of semiconductor material having opposing sidewall surfaces and an upper surface;
   a second layer of semiconductor material formed on and extending outwardly from the upper surface of the first layer of semiconductor material, the second layer of semiconductor material having opposing sidewall surfaces and an upper surface, and second layer of semiconductor material having a source/emitter region and collector/drain region;

a dielectric layer formed on the upper surface of the second layer of semiconductor material and on the opposing sidewall surfaces of the first and second layers of semiconductor material;

a gate formed on the dielectric layer; and conductive sidewall members, the conductive sidewall members coupling to the gate, and the conductive sidewall members disposed adjacent to portions of the dielectric layer formed on the opposing sidewall surfaces of the first and second layers of semiconductor material, and the conductive sidewall members having electrical contact to portions of the first layer of semiconductor material, and the conductive sidewall members operate conjunctively with the gate such that the transistor exhibits both bipolar transistor action (BJT) and metal-oxide semiconductor (MOS) transistor action.

13. The gated lateral bipolar transistor of claim 12, wherein the insulator layer formed on the semiconductor substrate comprises an oxide layer.

14. The gated lateral bipolar transistor of claim 12, wherein the first layer of semiconductor material is more highly doped than the second layer of semiconductor material.

15. The gated lateral bipolar transistor of claim 12, wherein conductive sidewall members are polysilicon.

16. The gated lateral bipolar transistor of claim 12, wherein the electrical contact of the conductive sidewall members to the first layer of semiconductor material gives bipolar junction transistor (BJT) action beneath the gate.

* * * * *